(12) United States Patent
Furukawa

(10) Patent No.: US 8,415,673 B2
(45) Date of Patent: Apr. 9, 2013

(54) THIN FILM TRANSISTOR AND SEMICONDUCTOR LAYER

(75) Inventor: Hiroaki Furukawa, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 13/130,141

(22) PCT Filed: Nov. 2, 2009

(86) PCT No.: PCT/JP2009/005824
§ 371 (c)(1),
(2), (4) Date: May 19, 2011

(87) PCT Pub. No.: WO2010/058528
PCT Pub. Date: May 27, 2010

(65) Prior Publication Data
US 2011/0220894 A1 Sep. 15, 2011

(30) Foreign Application Priority Data

Nov. 20, 2008 (JP) ................................. 2008-297296

(51) Int. Cl.
H01L 31/112 (2006.01)
H01L 29/04 (2006.01)

(52) U.S. Cl.
USPC .......................... 257/66; 257/57; 257/E29.273

(58) Field of Classification Search .................... 257/66, 257/618, E29.005, E29.273, 9, 57, 213
See application file for complete search history.

(56) References Cited

U.S. PATENT DOCUMENTS

| 5,381,029 | A |   | 1/1995  | Egchi et al. |
|-----------|---|---|---------|--------------|
| 5,470,762 | A |   | 11/1995 | Codama et al. |
| 5,834,812 | A | * | 11/1998 | Golland et al. ............... 257/347 |
| 2002/0179964 | A1 | | 12/2002 | Kato et al. |
| 2007/0257289 | A1 | | 11/2007 | Yang et al. |
| 2009/0250701 | A1 | | 10/2009 | Kimura |

FOREIGN PATENT DOCUMENTS

| JP | 02-122628 A | 5/1990 |
| JP | 04-363028 A | 12/1992 |

(Continued)

OTHER PUBLICATIONS

English translation of the International Preliminary Report on Patentability mailed Jun. 30, 2011 in corresponding PCT Application No. PCT/ JP2009/005824.

Primary Examiner — Nikolay Yushin
(74) Attorney, Agent, or Firm — Nixon & Vanderhye, P.C.

(57) ABSTRACT

A semiconductor layer (100) according to the present invention includes a top surface (100o), a bottom surface (100u) and a side surface (100s). In a portion of the side surface (100s) which is in the vicinity of a border with the top surface (100o), a tangential line (T1) to the portion is inclined with respect to the normal to the bottom surface (100u). In a certain portion of the side surface (100s) which is farther from the top surface (100o) than the portion in the vicinity of the border, an angle made by a tangential line (T2) to the certain portion and a plane defined by the bottom surface (100u) is larger than an angle made by the tangential line (T1) to the portion in the vicinity of the border and the plane defined by the bottom surface (100u).

13 Claims, 10 Drawing Sheets

FOREIGN PATENT DOCUMENTS

| | | |
|---|---|---|
| JP | 06-132303 A | 5/1994 |
| JP | 07-211697 A | 8/1995 |
| JP | 2002-324857 A | 11/2002 |
| JP | 2006-339556 A | 12/2006 |
| JP | 2007-142287 A | 6/2007 |
| JP | 2007-298947 A | 11/2007 |
| WO | 2007/017982 A1 | 2/2007 |
| WO | WO2007/017982 * | 2/2007 |

* cited by examiner

FIG.1
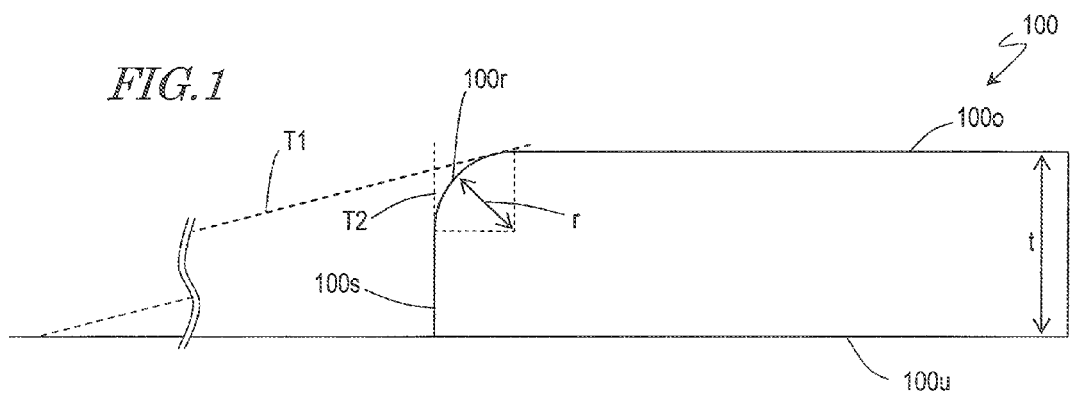
FIG.2
(a)
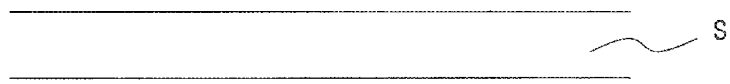
(b)
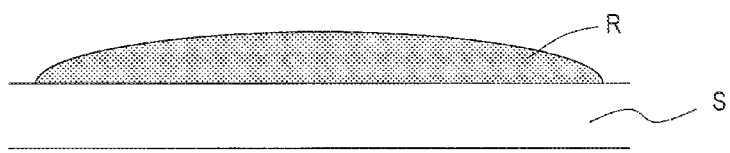
(c)
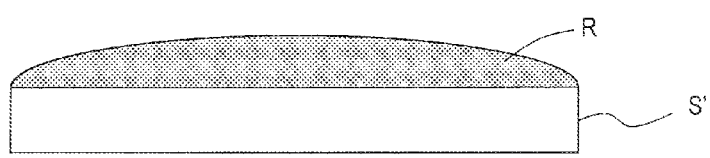
(d)
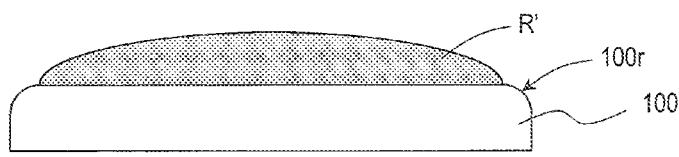
(e)

FIG.3
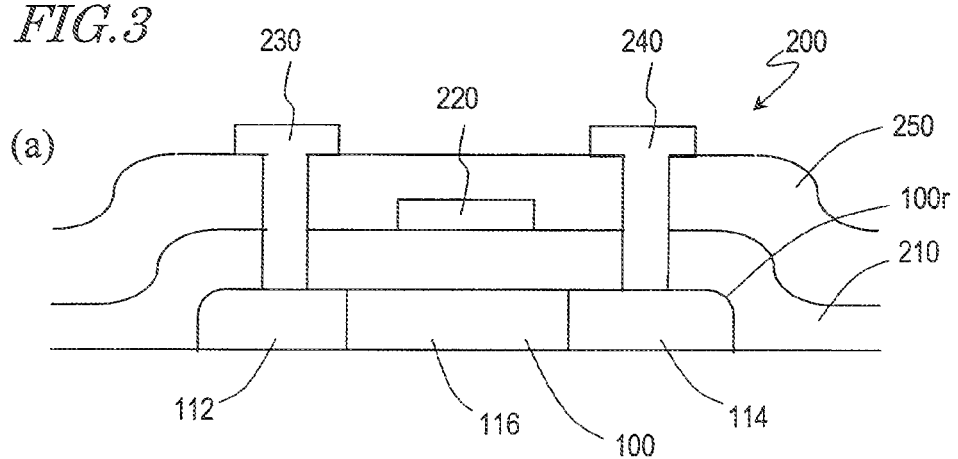
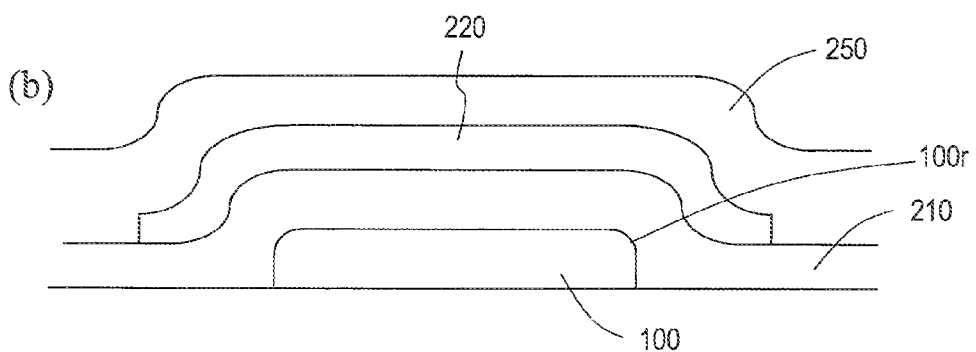

FIG.5
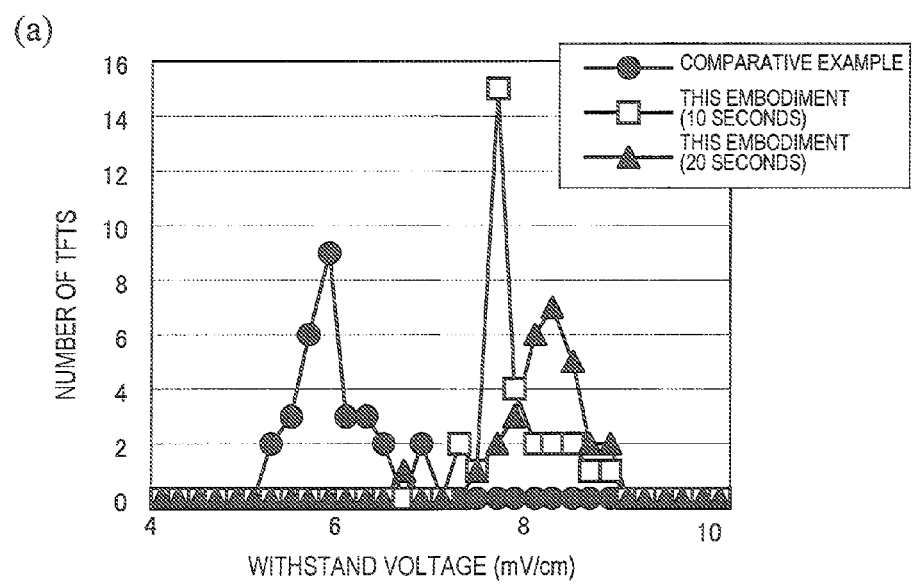
(a)
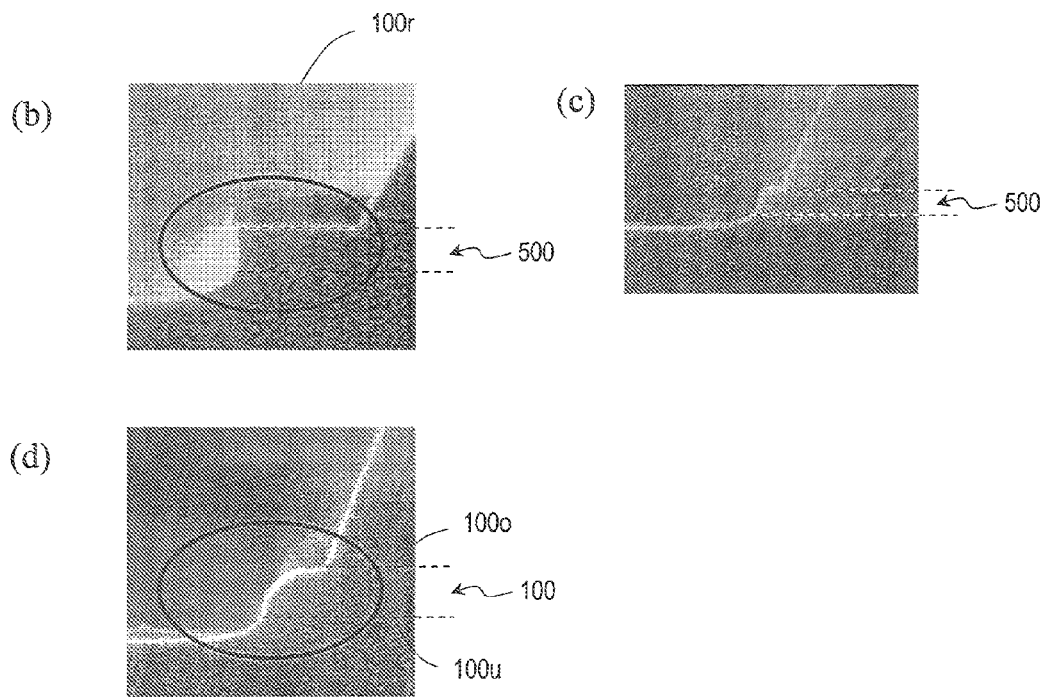
(b) (c) (d)

FIG. 6
(a) 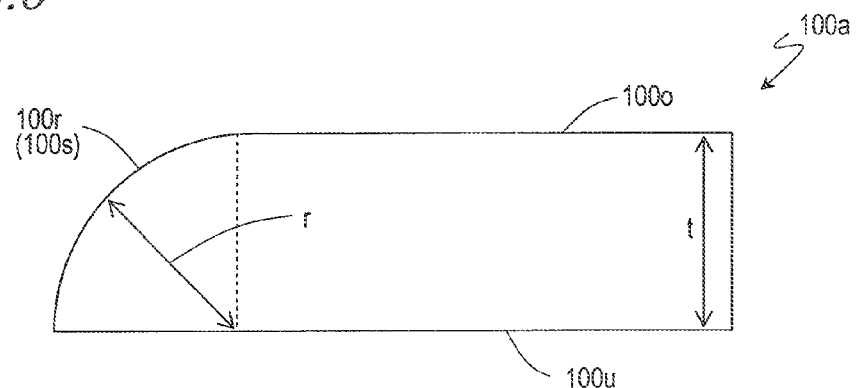
(b) 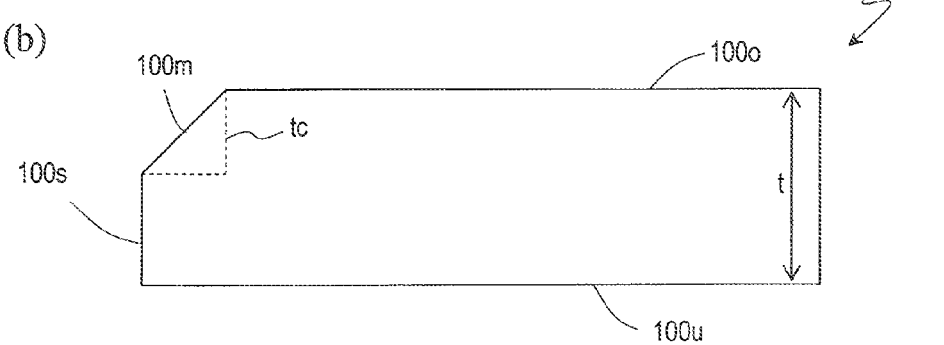
(c) 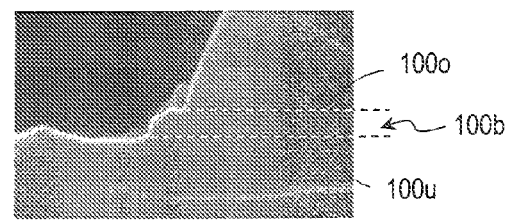
(d) 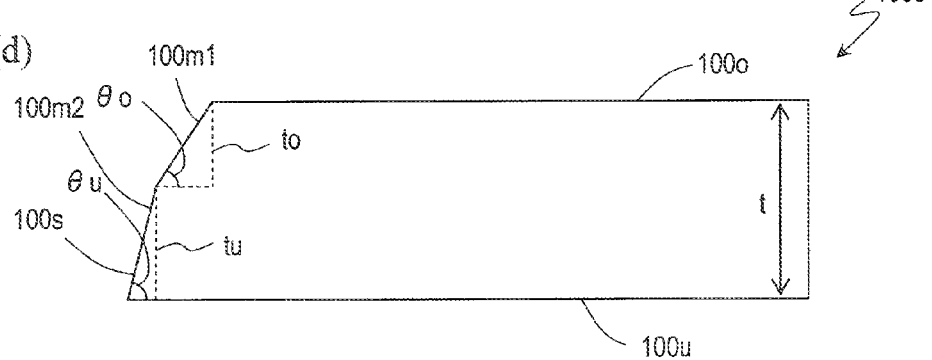

FIG.8
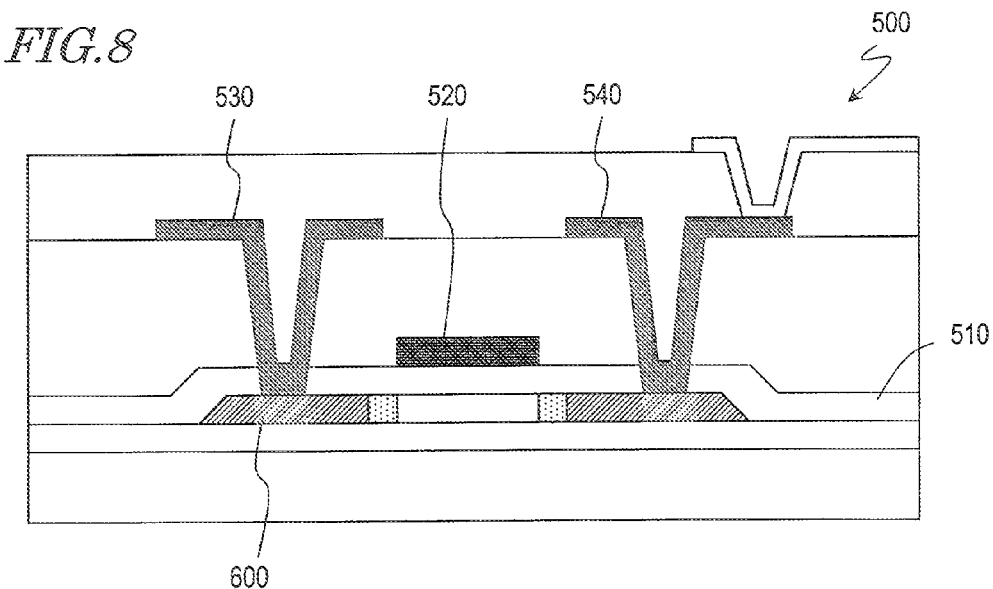
FIG.9
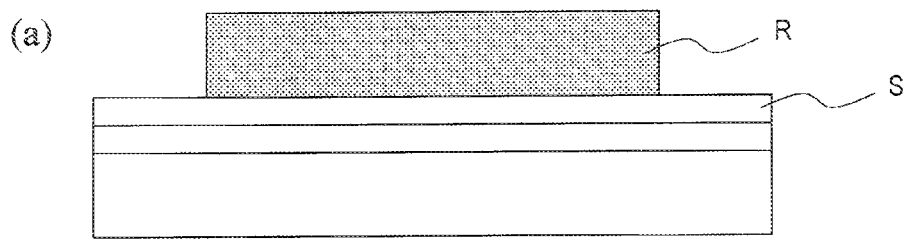
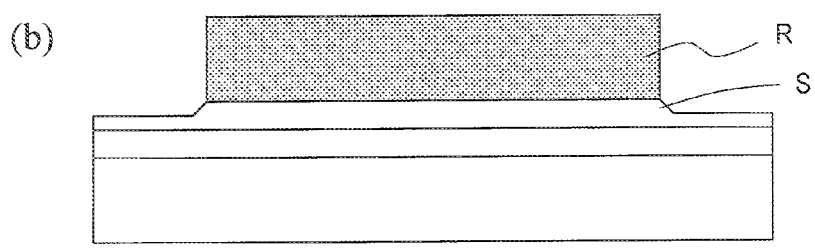
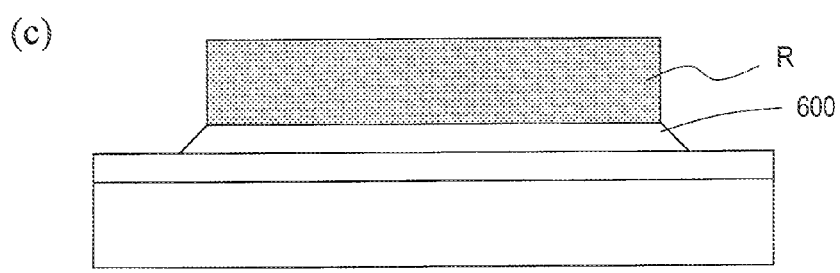

FIG.12
(a)
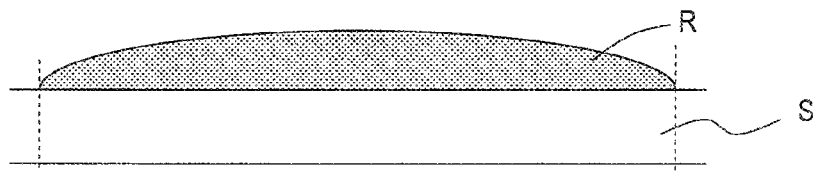
(b)
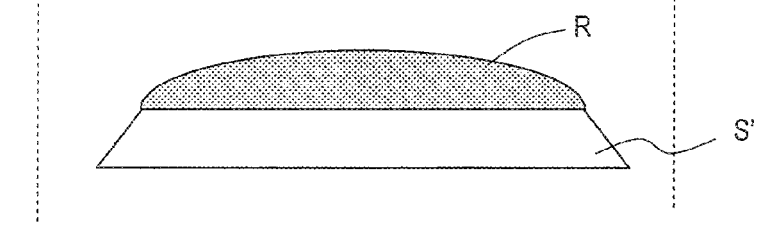
FIG.13
(a)
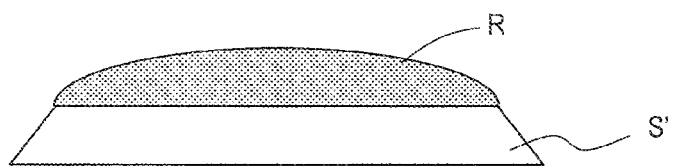
(b)
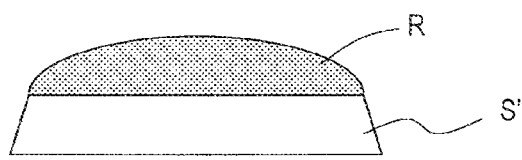
(c)
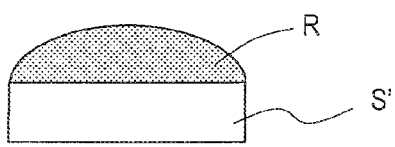

THIN FILM TRANSISTOR AND SEMICONDUCTOR LAYER

This application is the U.S. national phase of International Application No. PCT/JP2009/005824, filed 2 Nov. 2009, which designated the U.S. and claims priority to JP Application No. 2008-297296, filed 20 Nov. 2008, the entire contents of each of which are hereby incorporated by reference.

TECHNICAL FIELD

The present invention relates to a semiconductor layer and a method for forming the same.

BACKGROUND ART

A semiconductor layer can have conductivity thereof controlled and is usable as an active layer of a thin film transistor (TFT). A TFT is provided in, for example, an active matrix type liquid crystal display device, and such a liquid crystal display device is used as a display of TVs, computers, mobile terminals and the like.

A semiconductor layer is formed on a support substrate together with an insulating film, electrodes, wiring lines and the like by a technique similar to a technique used for producing a semiconductor integrated circuit such as a thin film formation technique, photolithography or the like. For example, in a TFT of a top-gate structure, a semiconductor layer is provided on an insulating surface; and on the semiconductor layer, a gate electrode is provided with a gate insulating film interposed therebetween.

It is known that in the TFT of a top-gate structure, the gate insulating film is thinner on an edge of the semiconductor layer than on the other regions of the semiconductor layer and that the distance between the edge of the semiconductor layer and the gate electrode is shorter than the distance between the other regions of the semiconductor layer and the gate electrode (see Patent Document 1). The tendency that the thickness of the gate insulating film is non-uniform as described above is more conspicuous as the gate insulating film is thinner.

Patent Document 1 describes that when the thickness of the gate insulating film is non-uniform, a strong electric field is formed at an edge of the semiconductor layer by the fringe effect and so a side current is generated, and as a result, the characteristics of the TFT as a switching device are deteriorated. As the distance between the edge of the semiconductor layer and the gate electrode is shorter, the absolute withstand voltage of the TFT is decreased due to the concentration of the electric field at the edge of the wiring lines of the semiconductor device. This is likely to cause a dielectric breakdown. Under such a situation, Patent Document 1 discloses a structure for suppressing a change in the thickness of the insulating film on the edge of the semiconductor film.

FIG. 8 shows a TFT 500 disclosed in Patent Document 1. The TFT 500 includes a semiconductor layer 600, a gate insulating film 510 for covering the semiconductor layer 600, a gate electrode 520 provided on the semiconductor layer 600 with the gate insulating film 510 interposed therebetween, and a source electrode 530 and a drain electrode 540 which are in contact with the semiconductor layer 600. The semiconductor layer 600 is tapered at an edge thereof, which suppresses a change in the thickness of the gate insulating film 510 and thus suppresses the deterioration in the characteristics of the TFT 500 as a switching device.

Patent Document 1 describes a method for forming the semiconductor layer 600. Hereinafter, with reference to FIG. 9, the method for forming the semiconductor layer 600 will be described.

First, as shown in FIG. 9(a), a semiconductor film S is deposited, and then a photoresist layer R is formed on the semiconductor film S.

Next, the semiconductor film S is etched using the photoresist layer R as a mask. As shown in FIG. 9(b), a portion of the semiconductor film S which is not covered with the photoresist layer R is removed by the etching, thereby forming an island-like semiconductor layer. By the etching, a part of the photoresist layer R is also removed from a side face thereof. When the part of the photoresist layer R is removed from the side face thereof, a portion of the island-like semiconductor layer which is exposed by the removal of the photoresist layer R is gradually etched from a top surface toward a bottom surface thereof. Therefore, as shown in FIG. 9(c), the semiconductor layer 600 obtained as a result of the etching has a tapered edge. Then, the photoresist layer R is removed, thereby forming the tapered semiconductor layer 600.

Patent Document 1 also discloses another TFT having a step-like semiconductor layer. FIG. 10 shows a TFT 700 disclosed in Patent Document 1. The TFT 700 includes a semiconductor layer 800, a gate insulating film 710 for covering the semiconductor layer 800, a gate electrode 720 provided on the semiconductor layer 800 with the gate insulating film 710 interposed therebetween, and a source electrode 730 and a drain electrode 740 which are in contact with the semiconductor layer 800. The semiconductor layer 800 is stepped at an edge thereof, which suppresses a change in the thickness of the gate insulating film 710 and thus suppresses the deterioration in the characteristics of the TFT 700 as a switching device.

Patent Document 1 describes a method for forming the semiconductor layer 800. Hereinafter, with reference to FIG. 11, the method for forming the semiconductor layer 800 will be described.

First, as shown in FIG. 11(a), a semiconductor film S is deposited, and then a photoresist layer R is formed on the semiconductor film S.

Next, the semiconductor film S is dry-etched using the photoresist layer R as a mask. As shown in FIG. 11(b), a portion of the semiconductor film S which is not covered with the photoresist layer R is removed by the etching, thereby forming an island-like semiconductor layer S'. The etching is performed using a gas which removes the semiconductor film S but does not remove the photoresist layer R.

Next, as shown in FIG. 11(c), the photoresist layer R is ached to remove a part of the photoresist layer R. As a result, a part of the island-like semiconductor layer S' is exposed. The aching is performed after the gas in the device is replaced with a gas which removes the photoresist layer R but does not remove the island-like semiconductor layer S'.

Next, as shown in FIG. 11(d), the island-like semiconductor layer S' is etched using the post-ashing photoresist layer R as a mask. The semiconductor layer 800 obtained as a result of the etching has a stepped edge. The etching is performed after the gas in the device is replaced with a gas which removes the semiconductor layer S' but does not remove the photoresist layer R.

Then, as shown in FIG. 11(e), the photoresist layer R is removed. In this manner, the semiconductor layer 800 having a stepped edge is formed.

CITATION LIST

Patent Literature

[Patent Document 1] Japanese Laid-Open Patent Publication No. 2007-298947

SUMMARY OF INVENTION

Technical Problem

With the method described above with reference to FIG. 9, the etching shift amount is too large to form the semiconductor layer in a sufficiently minute size. Hereinafter, with reference to FIG. 12, this will be explained.

FIG. 12(a) shows the semiconductor film S and the photoresist layer R before the etching. FIG. 12(b) shows the semiconductor layer S' and the photoresist layer R after the etching. In Patent Document 1, a cross-section of the photoresist layer R along the normal with respect to the surface of the substrate is shown as being rectangular. However, in actuality, the edge of the photoresist layer R is not necessarily vertical and is inclined to some extent.

As described above, in the case where the photoresist R is removed together with the semiconductor film S by etching, a desirable width of the semiconductor layer S' is smaller than the width of the pre-etching photoresist layer R. In the following explanation, the difference between the width of the pre-etching photoresist layer R and the desirable width of the semiconductor layer S' will be referred to also as the "etching shift". With the formation method disclosed in Patent Document 1, such an etching shift is caused. Therefore, in consideration of the etching shift amount, the width of the pre-etching photoresist layer R needs to be larger than the desirable width of the semiconductor layer S'. For this reason, it is difficult to form a plurality of semiconductor layer S' at a short interval. When the etching shift amount is larger, the variance in the width of the semiconductor layer S' is larger, and the variance in the characteristics of the TFT is also larger.

As the width of the semiconductor layer S' is smaller, the tapering angle of the edge of the semiconductor layer S' is closer to 90 degrees. With reference to FIG. 13, this will be explained. The tapering shape of the edge of the semiconductor layer S' is influenced by the shape of the photoresist layer R.

As shown in FIG. 13(a), when the width of the post-etching photoresist layer R is relatively large, the inclination angle of an edge of the photoresist layer R is relatively small. Therefore, the inclination angle of the edge of the semiconductor layer S' is also relatively small, and the edge of the semiconductor layer S' is tapered.

By contrast, as shown in FIG. 13(b) and FIG. 13(c), when the width of the post-etching photoresist layer R is small, the inclination angle of the edge of the photoresist layer R is relatively large. Therefore, the inclination angle of the edge of the semiconductor layer S' is close to 90 degrees. As described above, as the tapering angle of the edge of the semiconductor layer S' is closer to 90 degrees, the thickness of the insulating film to be provided thereon is changed more, which is likely to cause a dielectric breakdown.

With the formation method described above with reference to FIG. 11, ashing is performed between two types of etching. This requires the gas in the device to be replaced in accordance with whether ashing is to be performed or etching is to be performed.

The present invention, made in light of the above-described problems, has an object of providing a semiconductor layer which suppresses a dielectric breakdown and is suitable to be formed in a minute size, and a method for forming the same in a simple manner.

Solution to Problem

A semiconductor layer according to the present invention includes a top surface, a bottom surface and a side surface. A tangential line to a portion of the side surface which is in the vicinity of a border with the top surface is inclined with respect to the normal to the bottom surface; and an angle made by a tangential line to a certain portion of the side surface which is farther from the top surface than the portion in the vicinity of the border, and a plane defined by the bottom surface, is larger than an angle made by the tangential line to the portion in the vicinity of the border and the plane defined by the bottom surface.

In an embodiment, an angle made by a tangential line to each of portions of the side surface and the plane defined by the bottom surface increases monotonously from the portion in the vicinity of the border with the top surface of the semiconductor layer toward a portion in the vicinity of a border with the bottom surface of the semiconductor layer.

In an embodiment, the side surface has a rounded portion.

In an embodiment, the rounded portion has a radius of curvature of 20 nm or greater.

In an embodiment, the rounded portion has a radius of curvature which is equal to a thickness of the semiconductor layer.

In an embodiment, the rounded portion is located in a top portion of the side surface.

In an embodiment, the rounded portion extends over ⅓ or greater of the thickness of the semiconductor layer.

In an embodiment, the side surface includes an inclining flat face.

In an embodiment, the inclining flat face extends over ⅓ or greater of the thickness of the semiconductor layer.

In an embodiment, the side surface further includes a flat face vertical to the bottom surface.

In an embodiment, the side surface further includes another inclining flat face having a different inclination angle with respect to the bottom surface from that of the inclining flat face; and an angle made by the inclining flat face and the plane defined by the bottom surface is smaller than an angle made by the another inclining flat face and the plane defined by the bottom surface.

In an embodiment, the semiconductor layer has a thickness of 30 nm or greater and 80 nm or less.

A thin film transistor according to the present invention includes a substrate having an insulating surface; a semiconductor layer described above, which is provided on the insulating surface; a gate insulating film for covering the semiconductor layer; and a gate electrode facing a part of the semiconductor layer with the gate insulating film interposed therebetween.

A method for forming a semiconductor layer according to the present invention includes the steps of forming a semiconductor film; forming a photoresist layer on the semiconductor film; performing first etching of removing a part of the semiconductor film using the photoresist layer as a mask, thereby forming an island-like semiconductor layer; performing second etching, after the first etching, of removing at least a part of each of edges of the island-like semiconductor layer and the photoresist layer; and removing the photoresist layer after the second etching.

In an embodiment, in the second etching, an etching rate for the photoresist layer is higher than an etching rate for the island-like semiconductor layer.

In an embodiment, in the first etching, an etching rate for the semiconductor film is higher than an etching rate for the photoresist layer.

In an embodiment, a time duration in which the second etching is performed is shorter than a time duration in which the first etching is performed.

In an embodiment, in the second etching, the island-like semiconductor layer is etched anisotropically.

In an embodiment, in the step of performing the second etching, a rounded portion or an inclining flat face is formed on the edge of the semiconductor layer.

In an embodiment, the first etching includes dry etching using a mixed gas.

In an embodiment, the step of performing the second etching includes the step of making a mixing ratio of the mixed gas different from that in the first etching.

In an embodiment, the mixed gas contains methane tetrafluoride and oxygen.

In an embodiment, the step of performing the second etching includes the step of increasing a partial pressure ratio of oxygen as compared with that in the first etching.

A method for producing a thin film transistor according to the present invention includes the steps of preparing a substrate having an insulating surface; forming a semiconductor layer on the insulating surface in accordance with the formation method described above; forming a gate insulating film for covering the semiconductor layer; and forming a gate electrode on the semiconductor layer with the gate insulating film interposed therebetween.

Advantageous Effects of Invention

According to the present invention, a semiconductor layer which suppresses a dielectric breakdown and is suitable to be formed in a minute size, and a method for forming the same in a simple manner can be provided.

BRIEF DESCRIPTION OF THE DRAWINGS

FIG. 1 is a schematic view showing a semiconductor layer in an embodiment according to the present invention.

FIGS. 2(a) through (e) are schematic views showing a method for forming the semiconductor layer in the embodiment.

FIG. 3(a) is a schematic cross-sectional view of a TFT in an embodiment according to the present invention, and FIG. 3(b) is another schematic cross-sectional view of the TFT.

FIG. 5(a) is a graph showing the dielectric voltages of a TFT in a comparative example and the TFT in the embodiment; FIGS. 5(b) and (c) are photographs each showing a semiconductor layer in the comparative example, and FIG. 5(d) is a photograph showing the semiconductor layer in the embodiment.

FIGS. 6(a), (b) and (d) are each a schematic view showing a semiconductor layer in a modification of the embodiment, and FIG. 6(c) is a photograph showing the semiconductor layer in FIG. 6(b).

FIG. 8 is a schematic view showing a conventional TFT.

FIGS. 9(a) through (c) are schematic views showing a method for forming a semiconductor layer included in the TFT shown in FIG. 8.

FIGS. 12(a) and (b) are schematic views showing the relationship between a semiconductor film and a photoresist layer before etching and a semiconductor layer having a desirable width after etching.

FIGS. 13(a) through (c) are schematic views showing photoresist layers having different widths and corresponding semiconductor layers.

DESCRIPTION OF EMBODIMENTS

Figure 4:
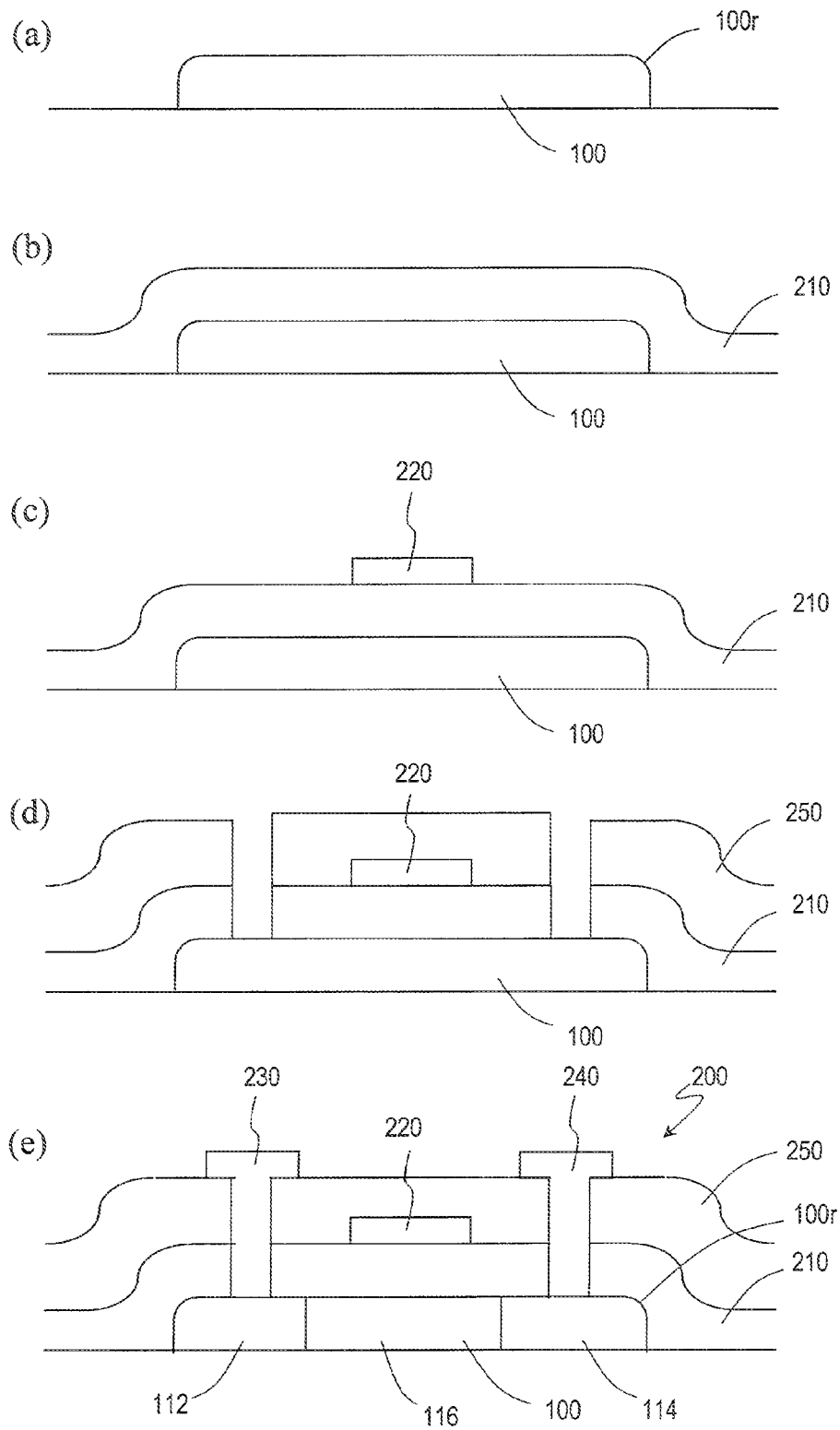
FIGS. 4(a) through (e) are schematic views showing a method for forming the TFT in the embodiment.

Hereinafter, embodiments of the present invention will be described with reference to the drawings. The present invention is not limited to the following embodiments.

Embodiment 1

Hereinafter, with Reference to FIG. 1, a Semiconductor layer in an embodiment according to the present invention will be described. A semiconductor layer 100 in this embodiment has a top surface 100o, a bottom surface 100u and a side surface 100s. The side surface 100s is continuous to an end of the top surface 100o and an end of the bottom surface 100u. A thickness t of the semiconductor layer 100 is 30 nm or greater and 80 nm or less, and preferably is 40 nm or greater and 60 nm or less. Herein, the thickness t of the semiconductor layer 100 is 50 nm.

The side surface 100s of the semiconductor layer 100 has a rounded portion 100r. The side surface 100s includes the rounded portion 100r and a flat face vertical to the bottom surface 100u. The rounded portion 100r is located in a top portion of the side surface 100s. Ideally, a cross-section of the rounded portion 100r corresponds to, for example, a part of a circle, and the radius of curvature r thereof is 20 nm. The semiconductor layer 100 has a width of 3 μm. Herein, the thickness t of the semiconductor layer 100 is larger than the radius of curvature r, and the center of curvature of the rounded portion 100r is within the semiconductor layer 100. In FIG. 1, the semiconductor layer 100 is schematically shown, and so the top surface 100o and the bottom surface 100u are flat planes parallel to each other.

Now, a tangential line to a portion of the side face 100s which is in the vicinity of a border with the top surface 100o will be discussed. A tangential line on the border line is parallel to, and does not cross, the bottom surface 100u. By contrast, a tangential line to the portion in the vicinity of the border crosses a plane defined by the bottom surface 100u at a small angle. In FIG. 1, straight line T1 represents this tangential line. The tangential line T1 is not parallel or perpendicular to the normal to the bottom surface 100u, and crosses the normal to the bottom surface 100u at an angle smaller than 90°. Paying attention to the relationship between the tangential line T1 and the bottom surface 100u, the tangential line T1 does not cross the bottom surface 100u and crosses a portion, of the plane defined by the bottom surface 100u, other than the bottom surface 100u. The angle made by the tangential line T1 and the plane defined by the bottom surface 100u is very small. As can be seen, the surface of the semiconductor layer 100 is inclined at an edge thereof. Therefore, when an insulating layer is provided on the semiconductor layer 100, the change in the thickness of the insulating layer can be suppressed. Also when a conductive member (e.g., a gate electrode) is provided on the semiconductor layer 100 with the insulating layer interposed therebetween, the dielectric breakdown can be suppressed even when the insulating layer is thin.

Now, a tangential line to a bottom end of the rounded portion 100r of the side surface 100s will be discussed. At the bottom end of the rounded portion 100r, a tangential line to the side surface 100s is parallel to the normal to the bottom surface 100u, and the angle made by this tangential line and the bottom surface 100u is 90°. In FIG. 1, straight line T2 represents this tangential line. Whereas the tangential line T1 described above does not cross the bottom surface 100u and crosses a portion, of the plane defined by the bottom surface 100u, other than the bottom surface 100u, the tangential line T2 crosses the edge of the bottom surface 100u.

As described above, the tangential lines T1 and T2 to the side surface 100s cross the plane defined by the bottom surface 100u at different angles. Specifically, the angle made by the tangential line T2 and the bottom surface 100u is larger than the angle made by the tangential line T1 and the plane defined by the bottom surface 100u. Therefore, although the portion in the vicinity of the border between the top surface 100o and the side surface 100s is inclined relatively largely, the distance between the end of the top surface 100o and the end of the bottom surface 100u when seen in the direction of the normal to the top surface 100o and the bottom surface 100u of the semiconductor layer 100 can be made short. Thus, as described later, the etching shift can be suppressed.

As described above, in the semiconductor layer 100 shown in FIG. 1, the side surface 100s includes the rounded portion 100r and the flat face vertical to the bottom surface 100u. Now, the angle made by a tangential line to each of portions of the side surface 100s from the top surface 100o to the bottom surface 100u of the semiconductor layer 100, and the plane defined by bottom surface 100u, will be discussed. The angle corresponding to the portion in the vicinity of the border is very small, but the angle corresponding to a portion of the rounded portion 100r closer to the bottom surface 100u is larger. The angle corresponding to the bottom end of the rounded portion 100r is 90°. Then, the angle corresponding to the vertical flat face is kept at 90°. As can be seen, the angle increases monotonously in correspondence with the portions of the side surface 100s from the top surface 100o toward the bottom surface 100u of the semiconductor layer 100.

As described above, the tangential line T1 to the portion in the vicinity of the border between the side surface 100s and the top surface 100o is inclined with respect to the normal to the bottom surface 100u, and the angle made by the tangential line T2 and the bottom surface 100u is larger than the angle made by the tangential line T1 and the plane defined by the bottom surface 100u. Therefore, considering, virtually, a plane including the end of the top surface 100o and the end of the bottom surface 100u (this plane will be referred to as the "virtual plane"), the side surface 100s protrudes from the virtual plane.

Hereinafter, with reference to FIG. 2, a method for forming the semiconductor layer 100 will be described.

First, as shown in FIG. 2(a), a semiconductor film S is deposited. The semiconductor film S contains, for example, a silicon material. After being deposited, the semiconductor film S may be crystallized by a low temperature polysilicon (LPS) technique or a continuous grain silicon (CGS) technique. Alternatively, the semiconductor film S containing amorphous silicon may be deposited and then used as being amorphous without being crystallized.

Next, as shown in FIG. 2(b), a photoresist layer R containing a photoresist material is formed. As the photoresist material, a novolac-based resist material or a chemically amplified photoresist material may be used. The photoresist layer R is formed by applying a photoresist film so as to cover the semiconductor film S and exposing the photoresist film in a prescribed pattern. The photoresist layer R is selectively provided on the semiconductor film S, so that a part of the region of the semiconductor film S is covered with the photoresist layer R and the rest of the region of the semiconductor film S is not covered with the photoresist layer R.

Next, as shown in FIG. 2(c), first etching is performed using the photoresist layer R. In the first etching, the etching rate for the semiconductor film S is higher than that for the photoresist layer R. Ideally, the etching rate for the photoresist layer R is zero.

Herein, the etching is dry etching, and is performed in a reactive ion etching device. For example, in the first etching, a mixed gas of $CF_4$ and $O_2$ is used as the etching gas. The partial pressure ratio of $CF_4$ and $O_2$ is 9:1. The partial pressure ratio of $CF_4$ and $O_2$ is, for example, 900 sccm:100 sccm. The time duration in which the first etching is performed is, for example, 60 seconds.

In the first etching, the etching rate for the photoresist layer R is low, whereas the etching rate for the semiconductor film S is high. The etching is performed anisotropically with the etching rate being higher in a direction vertical to the surface of the semiconductor film S. Therefore, the photoresist layer R is not removed almost at all. A portion of the semiconductor film S which is not covered with the photoresist layer R is removed, and a portion of the semiconductor film S which is covered with the photoresist layer R remains as an island-like semiconductor layer S'. In this case, after the first etching, the etching shift amount is small, and the island-like semiconductor layer S' has a generally vertical side surface.

Next, as shown in FIG. 2(d), second etching is performed using the photoresist layer R as a mask. In the second etching, the etching rate for the photoresist layer R is higher than that for the semiconductor layer S'. The etching rate for the semiconductor layer S' is not zero. From the viewpoint of selection ratio, the selection ratio of the second etching is lower than that of the first etching. Specifically, the ratio of the etching rate for the semiconductor material with respect to the etching rate for the photoresist material in the second etching is lower than the ratio of the etching rate for the semiconductor material with respect to the etching rate for the photoresist material in the first etching. The time duration in which the second etching is performed is shorter than the time duration in which the first etching is performed. The time duration in which the second etching is performed is, for example, 20 seconds.

For example, in the second etching, a mixed gas of $CF_4$ and $O_2$ is used as the etching gas like in the first etching. However, the second etching is performed with a higher partial pressure ratio of $O_2$ than in the first etching. Specifically, the partial pressure ratio of $CF_4$ and $O_2$ is changed to 6:4. The partial pressure ratio of $CF_4$ and $O_2$ is, for example, 600 sccm:400 sccm. By changing the partial pressure ratio of $CF_4$ and $O_2$ so as to increase the ratio of $O_2$ in this manner, the etching rate for the semiconductor film S and the semiconductor layer S' and the etching rate for the photoresist layer R can be changed. After the first etching, etching may be once stopped to change the partial pressure ratio before the second etching is started. Alternatively, the partial pressure ratio of $O_2$ may be increased step by step after each prescribed time interval, or may be continuously increased in accordance with the passage of time.

In the second etching, the etching rate for the photoresist layer R is high. Therefore, a part of the edge of the photoresist layer R is removed and thus the island-like semiconductor layer S' is exposed. The second etching is also performed anisotropically with the etching rate being higher in the direction vertical to the surface of the semiconductor layer S'. Therefore, a top portion of the edge of the exposed island-like semiconductor layer S' is removed. In this manner, a treatment of etching and rounding the edge of the semiconductor layer S' is performed, as a result of which, the semiconductor layer 100 having the rounded portion r is formed.

Next, as shown in FIG. 2(e), the photoresist layer R is removed. In the manner described above, the semiconductor layer 100 having the rounded portion r is formed.

As described above, in the first etching, the etching rate for the photoresist layer R is low and so the etching shift is small. In the second etching, the etching rate for the photoresist layer R is relatively high but the time duration in which the second etching is performed is short. Therefore, in the second etching, almost no etching shift occurs, and so the etching shift of the semiconductor layer S' is mainly influenced by the first etching. As can be seen, the etching shift can be suppressed, and owing to this, the semiconductor layer can easily be formed in a minute order. The second etching can be performed in the same device as the first etching, and so it is not necessary to, for example, move the support substrate. Therefore, the semiconductor layer 100 can be formed in a simple manner without substantially increasing the number of production steps except for changing the ratio of the mixed gas. In the second etching, the island-like semiconductor layer S' and the photoresist layer R are removed at the same time, which can reduce the treatment steps and the treatment time duration.

The semiconductor layer 100 in this embodiment is usable as, for example, an active layer of a TFT.

Hereinafter, with reference to FIG. 3, a TFT in an embodiment according to the present invention will be described. FIG. 3(a) shows a schematic cross-sectional view of a TFT 200 in this embodiment, and FIG. 3(b) shows another cross-sectional view of the TFT 200.

The TFT 200 includes the semiconductor layer 100, a gate insulating film 210, a gate electrode 220, a source electrode 230 and a drain electrode 240. Herein, the TFT 200 has a top-gate structure. The thickness of the gate insulating film 210 is, for example, 100 nm.

The semiconductor layer 100 has the rounded portion 100r. The semiconductor layer 100 includes a source region 112, a drain region 114 and a channel region 116 located between the source region 112 and the drain region 114. The channel region 116 faces the gate electrode 220 with the gate insulating film 210 interposed therebetween. The source region 112 and the drain region 114 of the semiconductor layer 100 contain impurities, and may be have a higher carrier mobility than that of the channel region 116.

The gate electrode 220 is covered with an inter-layer insulating film 250. The source electrode 230 and the drain electrode 240 are electrically connected to the source region 112 and the drain region 114 of the semiconductor layer 100, respectively, through contact holes formed in the gate insulating film 210 and the inter-layer insulating film 250.

In the TFT 200 in this embodiment, the semiconductor layer 100 has the rounded portion 100r so as to suppress a dielectric breakdown. For this reason, the semiconductor layer 100 can allow the gate insulating film 210 to be thin, and as a result, can decrease the threshold value of the gate voltage. Owing to this, the reduction of power consumption and a high-speed operation can be realized.

It is conceived that if the gate insulating film is merely thinned, the variance in the threshold voltage may occur due to the influence of a side current or the like. Nonetheless, in the TFT 200 in this embodiment, owing to the rounded portion 100r of the semiconductor layer 100, the threshold value of the gate voltage can be decreased while the variance thereof is suppressed. The rounded portion 100r of the semiconductor layer 100 can be observed using a scanning electron microscope or the like after the TFT 200 is destroyed.

Now, with reference to FIG. 4, a method for forming the TFT 200 will be described. First, as shown in FIG. 4(a), the semiconductor layer 100 having the rounded portion 100r is formed. The semiconductor layer 100 is formed as described above with respect to FIG. 2.

Next, as shown in FIG. 4(b), the gate insulating film 210 for covering the semiconductor layer 100 is formed. The gate insulating film 210 is formed of, for example, $SiO_2$ or SiN. Alternatively, the gate insulating film 210 may have a stacked structure of $SiN/SiO_2$. As described above, the semiconductor layer 100 has the rounded portion 100r, and so is well covered with the gate insulating film 210.

Next, as shown in FIG. 4(c), the gate electrode 220 is formed on the gate insulating film 210. The gate electrode 220 is formed of, for example, Mo or MoW. Alternatively, the gate electrode 220 may have a stacked structure of W/TaN or Ti/Al.

Next, as shown in FIG. 4(d), the inter-layer insulating film 250 for covering the gate insulating film 210 and the gate electrode 220 is formed, and then the gate insulating film 210 and the inter-layer insulating film 250 are etched to form contact holes. Thus, a part of the semiconductor layer 100 is exposed. Then, as necessary, impurities are introduced into the semiconductor layer 100.

Next, as shown in FIG. 4(e), the source electrode 230 and the drain electrode 240 are formed in contact with the semiconductor layer 100. The source electrode 230 and the drain electrode 240 have a stacked structure of, for example, Ti/Al/Ti, Ti/Al, TiN/Al/TiN, Mo/Al—Nd/Mo, Mo/Al/M or the like.

In this manner, the TFT 200 is formed. The semiconductor layer 100 has the rounded portion 100r. Owing to this, the concentration of the electric field in the edge of the semiconductor layer 100 is alleviated, and thus a dielectric breakdown can be suppressed.

Now, advantages of the TFT 200 in this embodiment will be described in comparison with a TFT in a comparative example. The TFT in the comparative example is produced as follows. During the formation process of the semiconductor layer 100 of the TFT 200, the partial pressure ratio of $CF_4$ and $O_2$ is changed in the second etching after the first etching. By contrast, during a formation process of a semiconductor layer of the TFT in the comparative example, the partial pressure ratio of $CF_4$ and $O_2$ is kept constant at 8:2 (specifically, 800 sccm:200 sccm) without being changed. In this case, the edge of the semiconductor layer is tapered.

The TFT 200 in this embodiment is produced in a manner similar to the manner described above with reference to FIG. 2 and FIG. 4. In order to check the influence of the treatment time duration of the second etching, the second etching is performed for two time durations of 10 seconds and 20 seconds.

FIG. 5(a) shows the dielectric voltages of the TFT in the comparative example and the TFT 200 in this embodiment. Herein, the design value of the width of the semiconductor layer is 2.0 μm. Thirty TFTs in the comparative example, 30

TFTs in this embodiment with one second etching treatment time duration, and 30 TFTs in this embodiment with the other second etching treatment time duration were prepared. The withstand voltage of each TFT was measured. The average withstand voltage of the TFTs in the comparative example was 6 mV/cm or less, whereas the average withstand voltage of the TFTs in this embodiment was higher at 7 mV/cm or greater even with the second etching treatment time duration of 10 seconds. The average withstand voltage of the TFTs in this embodiment with a longer second etching treatment time duration was still higher at 8 mV/cm or greater.

When the time duration in which the second etching is performed is short, the variance in the withstand voltage of the TFT 200 is small; whereas when the time duration in which the second etching is performed is long, the variance in the withstand voltage of the TFT 200 is larger. A reason for this is that when the time duration in which the second etching is performed is long, the variance in the etching shift amount and the variance in the width of the semiconductor layer are large.

FIG. 5(*b*) and FIG. 5(*c*) each show an electron micrograph of an edge of a semiconductor 500 of the TFT in the comparative example. FIG. 5(*d*) shows an electron micrograph of the edge of the semiconductor layer 100 of the TFT 200 in this embodiment. The edges of the semiconductor layers are observed by a scanning electron microscope. FIG. 5(*b*) and FIG. 5(*c*) show the semiconductor layers formed under the same conditions, but the angle of the side surface with respect to the bottom surface is slightly different due to the variance in the etching.

The edge of the semiconductor layer 500 of the TFT in the comparative example is straight, whereas the edge of the semiconductor layer 100 has the rounded portion 100*r*. From a comparison of FIG. 5(*b*) and FIG. 5(*c*) against FIG. 5(*d*), it is understood that a rounded portion is formed in the edge when the second etching is performed even for 10 seconds. When an observation is made by an electron microscope, the border plane between substances is occasionally difficult to see due to the intensity of the electron beams reflected by the materials to be observed. In this case, in order to emphasize the shape or structure of the semiconductor layer, the semiconductor layer may be immersed in hydrofluoric acid or the like to allow the border between the materials to stand out. Owing to this, the border of the semiconductor layer can easily be specified.

In the above description, the radius of curvature of the rounded portion 100*r* is constant. The present invention is not limited to this. The radius of curvature of the rounded portion 100*r* does not need to be constant. For example, the radius of curvature of a bottom part of the rounded portion 100*r* may be 20 nm and may continuously change to 30 nm toward a top part of the rounded portion 100*r*.

In the semiconductor layer 100 shown in FIG. 1, the rounded portion 100*r* is located in the top portion of the side surface 100*s* of the semiconductor layer 100. The present invention is not limited to this. As shown in FIG. 6(*a*), the rounded portion 100*r* may be provided in the entirety of the side surface 100*s* of a semiconductor layer 100*a*. In this case, it is preferable that the radius of curvature of the rounded portion 100*r* is equal to the thickness of the semiconductor layer 100*a*. Since the radius of curvature is equal to the thickness of the semiconductor layer, the curved face of the semiconductor layer 100*a* does not include any cornered portion. Therefore, the electric field is unlikely to be concentrated. For example, the radius of curvature of the rounded portion r and the thickness of the semiconductor layer 100*a* are each 50 nm. The semiconductor layer 100*a* like this is formed by performing the first etching with the partial pressure ratio of $CF_4$ and $O_2$ being 9:1 (specifically, 900 sccm: 100 sccm), changing the partial pressure ratio of $CF_4$ and $O_2$ to 6:4 (specifically, 600 sccm:400 sccm), and then performing the second etching. The second etching is performed for a relatively long time duration, and the time duration of the second etching step is, for example, for 30 seconds. By performing the second etching for a relatively long time duration like this, the rounded portion 100*r* is provided in the entirety of the side surface 100*s* of the semiconductor layer 100*a*.

Alternatively, the partial pressure ratio of $CF_4$ and $O_2$ may be changed, continuously or gradually by small steps, from $CF_4:O_2$=900 sccm:100 sccm in the first etching to $CF_4:O_2$=600 sccm:400 sccm in the second etching. Even when the etching is performed while changing the partial pressure ratio in such a manner, the rounded portion 100*r* is provided in the entirety of the side surface 100*s* of the semiconductor layer 100*a*.

In the semiconductor layer 100 shown in FIG. 1, it is the rounded portion 100*r* that is located in the top portion of the side surface 100*s*. The present invention is not limited to this. As shown in FIG. 6(*b*), an inclining flat face 100*m* may be provided in the top portion of the side surface 100*s* of a semiconductor layer 100*b*, and a flat face vertical to the bottom surface 100*u* may be provided in a bottom portion of the side surface 100*s*. In this case, it is preferable that the inclining flat face 100*m* extends over about ⅓ or greater of the thickness of the semiconductor layer 100*b*. For example, a thickness tc of the inclining flat face 100*m* is 20 nm, and the thickness of the semiconductor layer 100*b* is 50 nm. The semiconductor layer 100*b* like this is formed by performing the first etching with the partial pressure ratio of $CF_4$ and $O_2$ being 9:1 (specifically, 900 sccm:100 sccm) to process the side surface 100*s* of the semiconductor layer 100*b* to be vertical and then performing the second etching with the partial pressure ratio of $CF_4$ and $O_2$ being 5:5 (specifically, 500 sccm:500 sccm) for a relatively short time duration (e.g., 10 seconds). FIG. 6(*c*) shows an edge of the semiconductor layer 100*b* observed by a scanning electron microscope. The corner of the edge of the semiconductor layer 100*b* is partially treated. By making the partial pressure ratio of $O_2$ relatively high in the second etching as described above, the inclining flat face 100*m* can be formed on the side surface 100*s* of the semiconductor layer 100*b*.

In the semiconductor layer 100*b* shown in FIG. 6(*b*), the bottom portion of the side surface 100*s* is a flat face vertical to the bottom surface 100*u*. The present invention is not limited to this. As shown in FIG. 6(*d*), the bottom portion of the side surface 100*s* of a semiconductor layer 100*c* may be an inclining flat face 100*m*2 inclining with respect to the bottom surface 100*u*. In this case, it is preferable that a thickness tc of an upper inclining flat face 100*m*1 is smaller than a thickness tc of the lower inclining flat face 100*m*2 and that an inclination angle θo of the upper inclining flat face 100*m*1 with respect to the bottom surface 100*u* is smaller than an inclination angle θu of the lower inclining flat face 100*m*2 with respect to the bottom surface 100*u*. For example, the thickness of the semiconductor layer 100*c* is 50 nm, the thickness to of the upper inclining flat face 100*m*1 is 15 nm, and the thickness to of the lower inclining flat face 100*m*2 is 35 nm. The inclination angle θo is 30°, and the inclination angle θu is 80°.

The semiconductor layer 100*c* like this is formed as follows. The first etching is performed with the ratio of oxygen gas being relatively high. For example, the partial pressure ratio of $CF_4$ and $O_2$ is 8:2 (specifically, 800 sccm:200 sccm). Thus, the inclining flat face 100*m*2 is formed on the side surface 100*s* of the semiconductor layer. Then, the second etching is performed with the partial pressure ratio of $CF_4$ and $O_2$ being 5:5 (specifically, 500 sccm:500 sccm). Thus, the inclining flat face 100m1 is formed in the top portion of the side surface 100s of the semiconductor layer 100c.

The side surface 100s of the semiconductor layer 100c includes the inclining flat faces 100m1 and 100m2 having different inclination angles in the top portion and the bottom portion thereof. The shape of the bottom portion is mainly influenced by the first etching, and the shape of the top portion is mainly influenced by the second etching. As understood from the above explanation made with reference to FIG. 13, in the first etching, as the width of the photoresist layer is smaller and/or as the inclining flat face of the photoresist layer is steeper, the inclining flat face in the bottom portion is steeper. For example, when the width of the photoresist layer is 5 μm or less, the inclining flat face starts to become steep. When the width of the photoresist layer is 3 μm or less, the inclining angle of the semiconductor layer is 70° or larger. In the case where the photoresist layer is formed of a specific photoresist material which is likely to be tapered, even when the width of the photoresist layer is less than 3 μm, the inclination angle of the semiconductor layer can be 60° or smaller. As described above, by adjusting the partial pressure ratio and the treatment time duration of two types of etching, the side surface 100s of the semiconductor layer 100 can be of any of various shapes.

Figure 7:
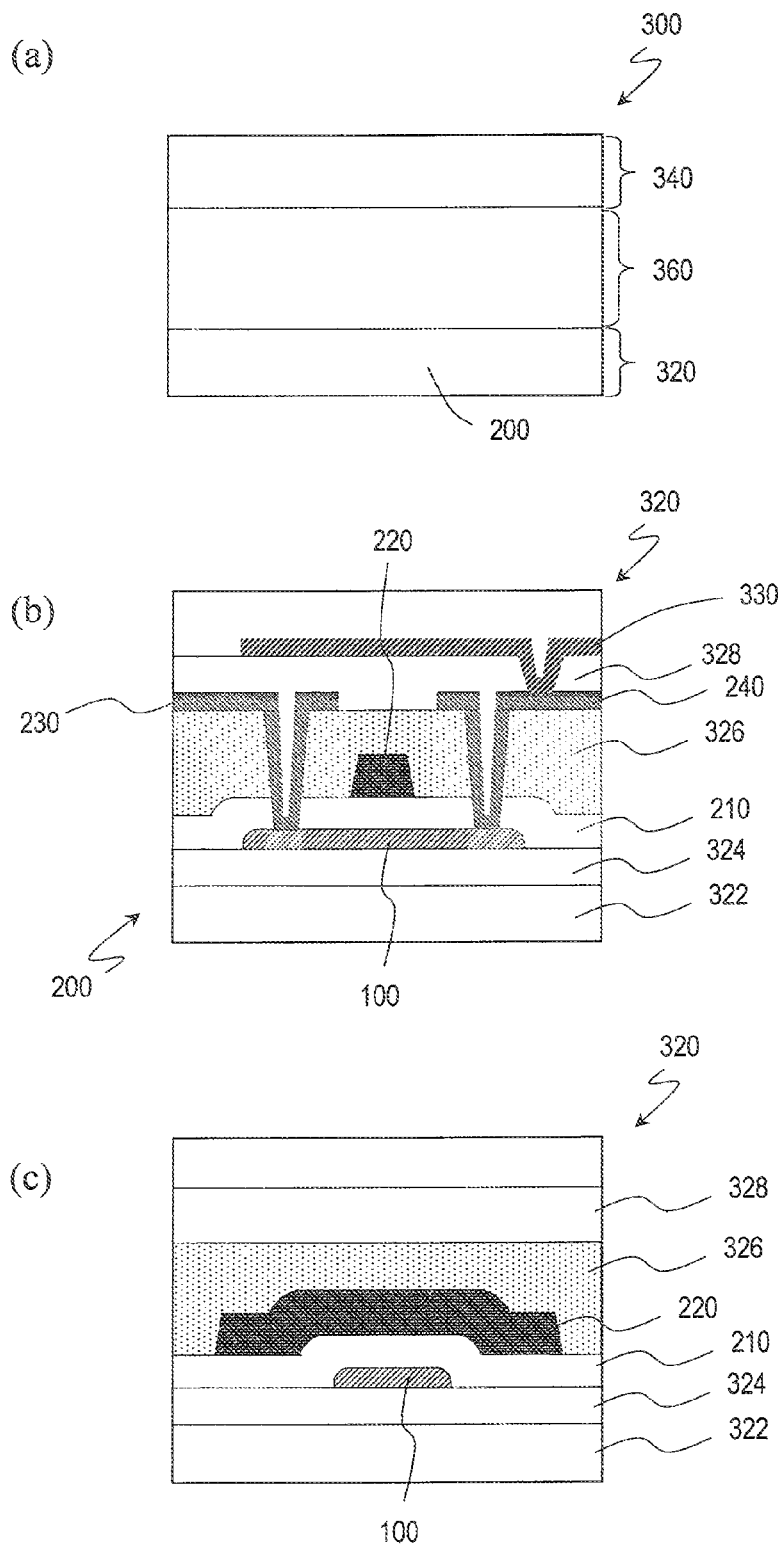
FIG. 7(a) is a schematic view of a liquid crystal display device in the embodiment.
FIG. 7(b) is a schematic cross-sectional view of an active matrix substrate of the liquid crystal display device.
FIG. 7(c) is another schematic cross-sectional view of the active matrix substrate.
Figure 10:
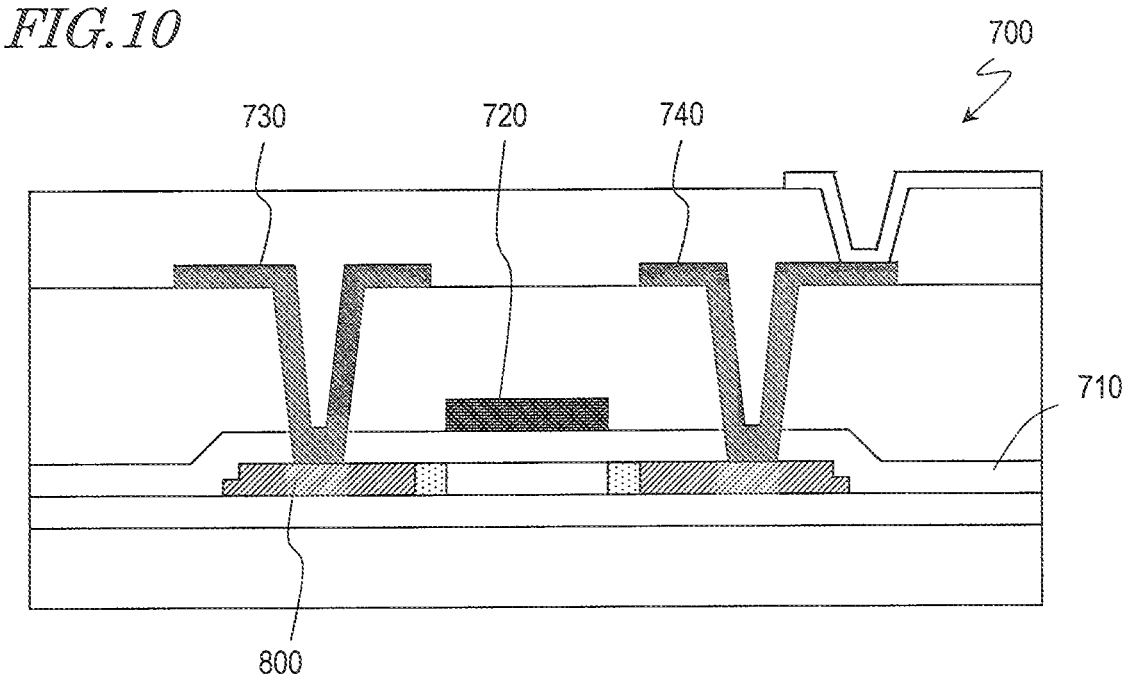
FIG. 10 is a schematic view showing another conventional TFT.
Figure 11:
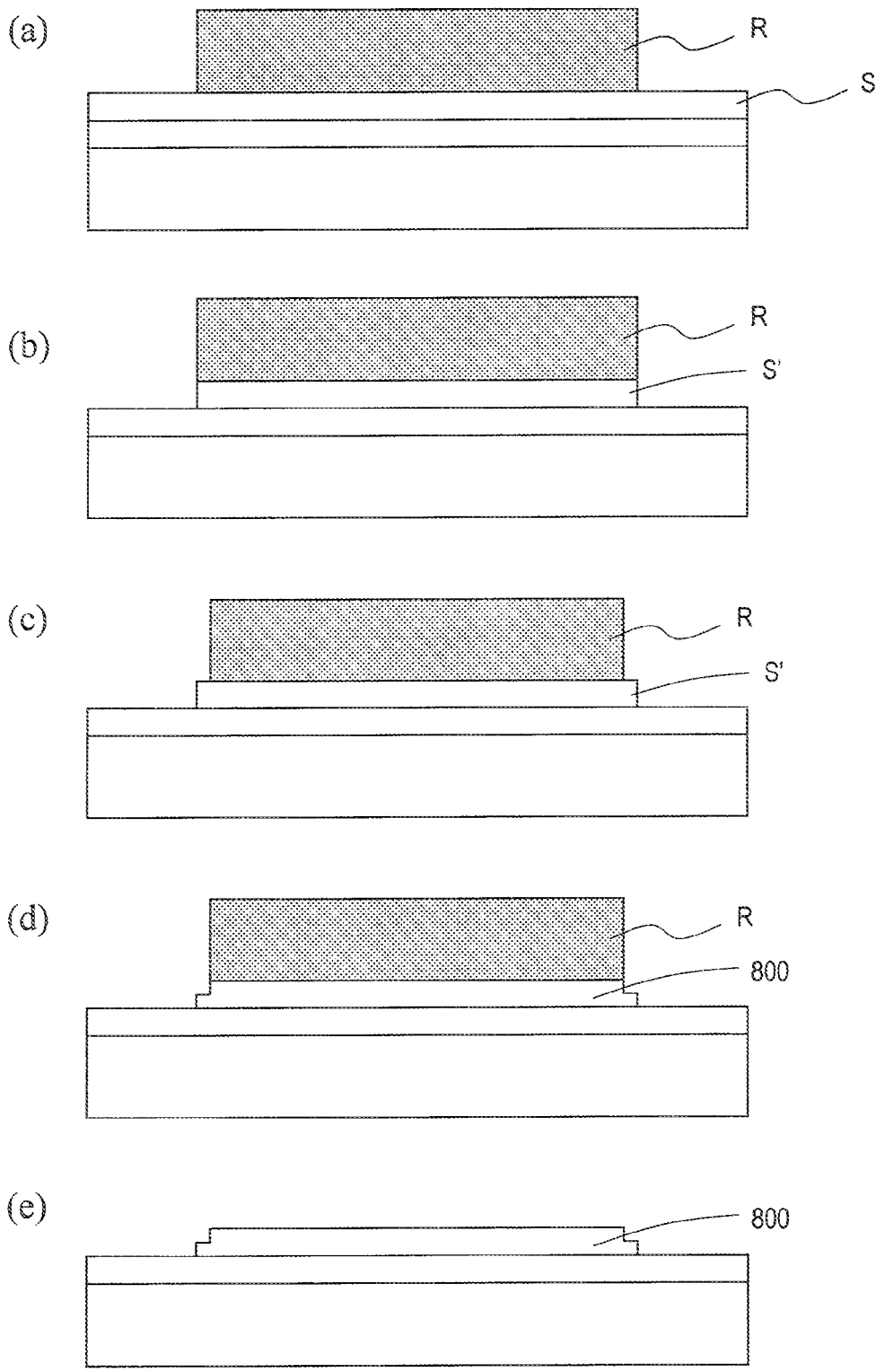
FIGS. 11(a) through (e) are schematic views showing a method for forming a semiconductor layer included in the TFT shown in FIG. 10.

The TFT 200 is preferably usable for a liquid crystal display device. Hereinafter, with reference to FIG. 7, a structure of a liquid crystal display device 300 including the TFT 200 will be described.

FIG. 7(a) is a schematic cross-sectional view of the liquid crystal display device 300 in this embodiment. The liquid crystal display device 300 includes an active matrix substrate 320, a counter substrate 340, and a liquid crystal layer 360 located between the active matrix substrate 320 and the counter substrate 340. The active matrix substrate 320 includes the TFT 200 described above.

FIG. 7(b) is a schematic cross-sectional view of the active matrix substrate 320. FIG. 7(c) is another cross-sectional view of the active matrix substrate 320.

The active matrix substrate 320 includes an insulating plate 322, a buffer layer 324, the TFT 200 provided on the buffer layer 324, an inter-layer insulating film 326 provided on the gate electrode 220 of the TFT 200, a protective film 328 for covering the source electrode, the drain electrode and the inter-layer insulating film 326, and a pixel electrode 330 provided on the protective film 328.

For example, the insulating plate 322 is a transparent glass plate. The buffer film 324 is formed of $SiO_2/SiNO$ or $SiO_2$. The inter-layer insulating film 326 is formed of $SiO_2$ or SiN. Alternatively, the inter-layer insulating film 326 may have a stacking structure of $SiO_2/SiN$, $SiO_2/SiN/SiO_2$ or the like. The protective film 328 is formed of an acrylic resin-based material. The pixel electrode 330 is formed of a transparent conductive material such as ITO, ZnO or the like.

In the liquid crystal display device 300, since the semiconductor layer 100 has the rounded portion 100r, the dielectric breakdown of the TFT 200 can be suppressed and the semiconductor layer 100 can be formed in a minute order easily. The rounded portion can also be formed by treating the semiconductor layer with thermal oxidation and, when necessary, removing the resultant oxide film by HF wet etching. The thermal oxidation is, for example, laser thermal oxidation, post-ion doping low-temperature thermal oxidation, water vapor oxidation or the like. Note that when thermal oxidation is performed, the thermal treatment is performed at a temperature higher than the softening point of the glass plate.

Therefore, it is preferable to form the rounded portion by removing the semiconductor layer and the photoresist layer as described above without performing thermal oxidation.

The semiconductor layer 100 of the TFT 200 shown in FIG. 7(b) and FIG. 7(c) is electrically connected to the pixel electrode 330, and the TFT 200 having such a structure is provided in a display region. The present invention is not limited to this. The TFT 200 may be provided in a frame region surrounding the display region. Alternatively, the TFT 200 may be provided both in the display region and the frame region.

In the above description, the semiconductor layer 100 is used as the active layer of the TFT 200. The present invention is not limited to this. Impurities may be introduced into the semiconductor layer 100 to increase the carrier mobility of the semiconductor layer 100, so that the semiconductor layer 100 can be used as a so-called wiring line. For example, the semiconductor layer 100 formed in a region of the deposited semiconductor film S which is other than the region used as the active layer of the TFT may be used as a wiring line. Alternatively, whereas a part of the semiconductor layer 100 acts as an active layer of the TFT, another part thereof may act as a wiring line.

The disclosure of Japanese Patent Application No. 2008-297296, based upon which the present application claims the benefit of priority, is incorporated herein by reference.

INDUSTRIAL APPLICABILITY

A semiconductor layer according to the present invention is suitable to be formed in a minute order, and a TFT including such a semiconductor layer can suppress a dielectric breakdown. A liquid crystal display device including such a TFT is preferably usable for a mobile phone, a mobile information terminal (PDA), a game device or the like.

REFERENCE SIGNS LIST

100 Semiconductor layer
112 Source region
114 Drain region
116 Channel region
200 TFT
210 Gate insulating film
220 Gate electrode
230 Source electrode
240 Drain electrode
300 Liquid crystal display device

The invention claimed is:
1. A semiconductor layer, comprising a top surface, a bottom surface and a side surface, wherein:
a tangential line to a portion of the side surface which is in the vicinity of a border with the top surface is inclined with respect to the normal to the bottom surface; and
an angle made by a tangential line to a certain portion of the side surface which is farther from the top surface than the portion of the side surface in the vicinity of the border with the top surface, and a plane defined by the bottom surface, is larger than an angle made by the tangential line to the portion of the side surface in the vicinity of the border with the top surface and the plane defined by the bottom surface, the side surface including an inclining flat face, wherein the side surface further includes another inclining flat face having a different inclination angle with respect to the bottom surface from that of the inclining flat face; and an angle made by the inclining flat face and the plane defined by the bottom surface is smaller than an angle made by the another inclining flat face and the plane defined by the bottom surface.

2. A thin film transistor, comprising:
a substrate having an insulating surface;
a semiconductor layer provided on the insulating surface, the semiconductor layer having a top surface, a bottom surface and a side surface, wherein:
a tangential line to a portion of the side surface which is in the vicinity of a border with the top surface is inclined with respect to the normal to the bottom surface; and
an angle made by a tangential line to a certain portion of the side surface which is farther from the top surface than the portion of the side surface in the vicinity of the border with the top surface, and a plane defined by the bottom surface, is larger than an angle made by the tangential line to the portion of the side surface in the vicinity of the border with the top surface and the plane defined by the bottom surface;
a gate insulating film for covering the semiconductor layer; and
a gate electrode facing a part of the semiconductor layer with the gate insulating film interposed therebetween.

3. The thin film transistor of claim 2, wherein an angle made by a tangential line to each of portions of the side surface and the plane defined by the bottom surface increases monotonously from the portion of the side surface in the vicinity of the border with the top surface of the semiconductor layer toward a portion of the side surface in the vicinity of a border with the bottom surface of the semiconductor layer.

4. The thin film transistor of claim 2, wherein the semiconductor layer has a thickness of 30 nm or greater and 80 nm or less.

5. The thin film transistor of claim 2, wherein the side surface includes an inclining flat face.

6. The thin film transistor of claim 5, wherein the inclining flat face extends over ⅓ or greater of the thickness of the semiconductor layer.

7. The thin film transistor of claim 5, wherein the side surface further includes a flat face vertical to the bottom surface.

8. The thin film transistor of claim 5, wherein:
the side surface further includes another inclining flat face having a different inclination angle with respect to the bottom surface from that of the inclining flat face; and
an angle made by the inclining flat face and the plane defined by the bottom surface is smaller than an angle made by the another inclining flat face and the plane defined by the bottom surface.

9. The thin film transistor of claim 2, wherein the side surface has a rounded portion.

10. The thin film transistor of claim 9, wherein the rounded portion has a radius of curvature of 20 nm or greater.

11. The thin film transistor of claim 9, wherein the rounded portion has a radius of curvature which is equal to a thickness of the semiconductor layer.

12. The thin film transistor of claim 9, wherein the rounded portion is located in a top portion of the side surface.

13. The thin film transistor of claim 9, wherein the rounded portion extends over ⅓ or greater of the thickness of the semiconductor layer.

* * * * *